United States Patent
Fuller

(10) Patent No.: US 9,887,087 B1
(45) Date of Patent: Feb. 6, 2018

(54) SEMICONDUCTOR AND OTHER MATERIALS BY THERMAL NEUTRON TRANSMUTATION

(71) Applicant: Michael Keith Fuller, Salinas, CA (US)

(72) Inventor: Michael Keith Fuller, Salinas, CA (US)

( * ) Notice: Subject to any disclaimer, the term of this patent is extended or adjusted under 35 U.S.C. 154(b) by 100 days.

(21) Appl. No.: 14/325,647

(22) Filed: Jul. 8, 2014

(51) Int. Cl.
*H01L 21/26* (2006.01)
*H01L 21/261* (2006.01)
(Continued)

(52) U.S. Cl.
CPC .......... *H01L 21/261* (2013.01); *H01L 21/187* (2013.01); *H01L 21/78* (2013.01);
(Continued)

(58) Field of Classification Search
CPC ... H01L 21/261; H01L 21/263; H01L 29/861; H01L 31/107; H01L 29/32; H01L 29/868; H01L 29/0634; H01L 29/1095; H01L 29/66348; H01L 21/26513; H01L 21/3221; H01L 29/7813; H01L 27/14643; H01L 29/0821; H01L 27/0255; H01L 27/11502; H01L 27/11507; H01L 27/1203; H01L 27/14603; H01L 27/1463; H01L 27/14658; H01L 27/14676; H01L 27/1469; H01L 27/14831; H01L 27/14875;
(Continued)

(56) References Cited

U.S. PATENT DOCUMENTS 3,255,050 A * 6/1966 Klahr ................ H01L 21/00
117/2
3,967,982 A * 7/1976 Arndt ................ H01L 21/033
148/DIG. 165
(Continued)

OTHER PUBLICATIONS

Hughes NPL non patent literature "Neutron Optics" in Annual Reviews Journal: Nuclear Science. 1953 V3, pp. 93-118.*
(Continued)

*Primary Examiner* — Sean P Burke

(57) ABSTRACT

A method of manufacturing p-n junction in semiconductor material such that small dimensions of such junctions are maintained, and associated lattice dislocations of such junctions may be preferentially maintained, and devices with such patterned semiconductor material, is disclosed. Typically, a neutron moderator is used to slow fast neutrons to thermal energies. A mask made from thermal neutron absorbing material, such as cadmium, is placed in close proximity to such neutron moderator. Thermal neutron focusing optics, such as compound refractive lenses, are used to collect and focus thermal neutrons emitted from the mask such that the pattern or portion of the pattern is transferred to the silicon body, with neutrons transmitted from the window areas in the mask and through the neutron optic so as to form the donor dopant concentration for the n-type regions by transmutation of silicon atoms into phosphorus. An electronic device produced by such a method has vertical p-n junctions continuous between both major surfaces and horizontal alternating p-type and n-type regions across most of the face of the material, such that unique properties are achieved.

12 Claims, 5 Drawing Sheets

(51) Int. Cl.
*H01L 33/00* (2010.01)
*H01L 33/34* (2010.01)
*H01L 31/18* (2006.01)
*H01L 31/0288* (2006.01)
*H01L 35/34* (2006.01)
*H01L 35/22* (2006.01)
*H01L 29/167* (2006.01)
*H01L 29/06* (2006.01)
*H01L 29/66* (2006.01)
*H01L 21/78* (2006.01)
*H01L 21/18* (2006.01)
*H01S 5/32* (2006.01)
*H01L 21/66* (2006.01)
*H01L 31/0216* (2014.01)

(52) U.S. Cl.
CPC ............ *H01L 22/12* (2013.01); *H01L 29/063* (2013.01); *H01L 29/167* (2013.01); *H01L 29/66568* (2013.01); *H01L 31/0288* (2013.01); *H01L 31/02168* (2013.01); *H01L 31/1804* (2013.01); *H01L 33/0054* (2013.01); *H01L 33/343* (2013.01); *H01L 35/22* (2013.01); *H01L 35/34* (2013.01); *H01S 5/3224* (2013.01)

(58) Field of Classification Search
CPC ... H01L 27/14887; H01L 29/00; H01L 29/02; H01L 29/7408; H01L 29/7424; H01L 29/7811; H01L 29/8613; H01L 29/87; H01L 31/0224; H01L 31/0352; H01L 31/03682; H01L 31/0406; H01L 31/1105; H01L 31/115; H01L 31/117; H01L 31/18; H01L 33/025; H01L 33/06
USPC ......... 438/512, 514, 139, 530, 54, 798, 904, 438/133, 269, 522, 91, 965, 105, 134, 438/200, 22, 259, 289, 309, 415, 46, 476, 438/492, 501, 510, 518, 520, 535, 544, 438/56, 587, 607, 73, 938, 135, 138, 144, 438/151, 17, 197, 217, 226, 234, 268, 438/270, 291, 341, 357, 358, 36, 360
See application file for complete search history.

(56) References Cited

U.S. PATENT DOCUMENTS

| | | | | |
|---|---|---|---|---|
| 4,348,351 | A * | 9/1982 | Kramer | H01L 21/261 257/E21.33 |
| 4,728,371 | A * | 3/1988 | Haas | C30B 31/20 148/DIG. 165 |
| 4,754,310 | A * | 6/1988 | Coe | H01L 29/0634 257/287 |
| 5,216,275 | A * | 6/1993 | Chen | H01L 29/0634 257/266 |
| 5,438,215 | A * | 8/1995 | Tihanyi | H01L 29/0634 257/341 |
| 5,880,478 | A * | 3/1999 | Bishop | G21K 1/06 250/251 |
| 6,027,953 | A * | 2/2000 | Liao | H01L 27/14658 257/E27.14 |
| 6,028,329 | A * | 2/2000 | Liao | H01L 21/261 257/197 |
| 6,040,600 | A * | 3/2000 | Uenishi | H01L 21/26546 257/330 |
| 6,100,168 | A * | 8/2000 | Liao | H01L 21/261 257/E21.33 |
| 6,114,225 | A * | 9/2000 | Liao | H01L 21/261 257/E21.33 |
| 6,274,456 | B1 * | 8/2001 | Liao | H01L 21/761 257/E21.544 |
| 6,703,292 | B1 * | 3/2004 | Grover | H01L 21/261 257/E21.33 |
| 9,412,481 | B1 | 8/2016 | Fuller | |

OTHER PUBLICATIONS

Kumakhov et al., "Neutron Focusing Using Capillary Optics".*
U.S. Appl. No. 62/497,067, filed Nov. 29, 2016, Fuller, Michael Keith

* cited by examiner

SEMICONDUCTOR AND OTHER MATERIALS BY THERMAL NEUTRON TRANSMUTATION

BACKGROUND OF THE INVENTION

This invention relates to the manufacture of semiconductor devices with a depletable multiple-region semiconductor material that provides a voltage-sustaining space-charge zone when depleted, and to a method of fabricating such a material. The invention also relates to other semiconductor material and semiconductor devices produced by such methods.

The voltage-sustaining space-charge zone results from charge-carrier depletion of interposed p-type and n-type regions that form multiple p-n junctions in the material. The intermediate dimensions (width or thickness) of the interposed p-type and n-type regions need to be small enough (in relation to their dopant concentrations) to allow depletion of the region across its intermediate dimension without the resulting electric field reaching the critical field strength at which avalanche breakdown would occur in that semiconductor. This is an extension of the famous RESURF principle. Thus, the depletable multiple-region material may be termed "multiple p-n RESURF" material. In the voltage-sustaining zone formed of first regions of one conductivity type interposed with second regions of the opposite conductivity type, the dopant concentration and dimensions of the first and second regions are such that (when depleted in a high voltage mode of operation) the space charge per unit area in the first and second regions balances at least to the extent that the electric field resulting from the space charge is less than the critical field strength at which avalanche breakdown would occur in that zone.

The photovoltaic solar cell industry is extremely cost sensitive, and the cost of a starting silicon wafer is typically nearly half of the value of the finished photovoltaic module. Thus, in this industry it is extremely important that the silicon wafers are used as efficiently as possible. Most photovoltaic solar cells are manufactured by processes on the major surfaces of the silicon wafer, resulting in a depletion zone(s) parallel to the major surfaces. Efficiency of the conversion of light to electron-hole pairs is maximized at the depth of the depletion zone, but is considerably less at other depths. High-purity silicon crystal offsets some of these losses by providing an extended diffusion length, but is more expensive to produce and still has deep regions that poorly contribute to electron-hole pair conversion. Depth of light conversion is also strongly related to photon energy (wavelength), resulting in losses of otherwise useful parts of the solar spectrum.

U.S. Pat. No. 6,703,292 (Grover) discloses a method for producing semiconductor devices with depletable multiple-region (multiple p-n junction RESURF) semiconductor material comprising alternating p-type and n-type regions which utilizes patterned Neutron Transmutation Doping (NTD). Grover's method is an improvement over previous procedures, and uses a collimated beam of thermal neutrons and a neutron-absorbing mask in close proximity to the semiconductor material. Two problems exist for Grover's method; one, thermal neutrons are not easily collimated, and two, masks have large feature sizes as a result of their manufacturing methods. Such large feature sizes are carried into the semiconductor material and exacerbated by diffraction effects at the edges of features in the proximity mask. Similar limitations occur in the exposure step in x-ray proximity lithography, which has most of the same elements as described in Grover's method.

The standard approach for collimating x-rays used at synchrotron facilities, which is to provide great distance from a small origin to the work necessary for proximity lithography, is not effective for thermal neutrons. Thermal neutrons are "produced" in moderating material, such that fast neutrons are slowed to thermal energies via scattering reactions. Consequently, the neutron flux is distributed throughout the moderator and any neutrons leaving the moderator do so with random angular direction. Collimating the exiting thermal neutrons via transmission grids and/or a reduction apertures results in a significant flux reduction. Additionally, thermal neutrons are relatively slow moving, heavy particles with flight paths that are affected by gravity. Grover does not state any method for producing a collimated beam of thermal neutrons sufficient to transmute silicon atoms to phosphorus in a pattern, and it is unclear if the invention has ever been practiced.

In contrast to the exposure step in proximity lithography, which is similar to Grover's method for patterned neutron transmutation doping, exposures in projection lithography are controlled by focusing optics. In this more common process, ultraviolet radiation exiting absorbing masks with large features sizes are projected and demagnified by optical components. In addition to the obvious benefit of imprinting small features, the projection method also reduces the requirements for collimated illumination and controls for mask-edge diffraction effects. It is standard practice in optical projection lithography to have multiple exposures to produce a precise pattern. Prior to this disclosure, no neutron optical projection lithography methods have been proposed for Neutron Transmutation Doping (NTD), a common bulk material doping process.

Photovoltaic (PV) cells are semiconductor devices that convert light to electrical voltage, and are generally made of doped silicon material. Typically, p-type doped silicon is produced as a wafer or substrate onto which n-type doped silicon is deposited. A depletion zone forms in the region of the p-n junction, as discussed above. Photons of light that are absorbed in the depletion zone contribute to the cell's electrical current at nearly 100% probability, as the electron-hole pair are quickly swept apart by the electric field and are collected. Away from the junction, the collection probability drops off. If the carrier is generated more than a diffusion length away from the junction, then the collection probability of this carrier is quite low. Unfortunately, most photons are absorbed in regions that are shallower or deeper than the depletion zone and overall light-to-electricity efficiency is reduced.

The nature and magnitude of a material's band structure are parameters which influence the electronic and optoelectronic devices fabricated therefrom. For example, diodes made from semiconductors with wide bandgaps will tend to have higher breakdown voltages because these materials will have fewer thermally-generated charge carriers at any given temperature and therefore will be less susceptible to avalanche effects. Gallium arsenide will be a material of choice for radiation-generating devices because it has a direct bandgap. Silicon, on the other hand, has been considered fundamentally unsuitable for use as an emitter of radiation. This is because silicon is an indirect bandgap material in which fast, non-radiative recombination processes completely dominate the much slower radiative recombination processes. Indeed in bulk silicon, at room temperature, radiation emission is almost entirely absent.

With the continuing and rapid development of computer processors, the constant demand for increased processing power and speed and reduced size necessitates an ever increasing complexity of the interconnecting metallisations. It is anticipated that this complexity will eventually present an insurmountable obstacle to further development (the breakdown of Moore's Law) because electrons will spend a disproportionate amount of time in the metallisations instead of in the components they interconnect, thereby curtailing processing power and speed.

Optoelectronic circuits based on silicon technology offer a way forward because optical coupling is many orders of magnitude faster than connections based on the diffusion of charge carriers. However, this approach requires development of an efficient room temperature radiation-emissive device based on silicon. Clearly, such a device could be used to enhance the functionality of other silicon devices and could lead to implementation of all-silicon integrated optoelectronic systems.

Prior techniques for making a silicon-based optoelectronic device include porous or nano-particle silicon, or multilayer compound semiconductors, either of which is not bulk silicon. Some attempts of ion implantation to form strain fields within silicon have had limited success, with poor focusing at higher energy/penetration depths being the main drawback (Homewood et al, U.S. Pat. No. 7,274,041).

It is obvious that a method is needed for producing closely matched and closely spaced p and n type doping for vertical devices. It is also obvious that more economical vertical devices manufactured from less pure silicon crystal, polycrystalline silicon, or hydrogenated amorphous silicon is needed. It is also obvious that a more efficient photovoltaic cell is needed, particularly a photovoltaic cell that has uniformly high contribution to current for carriers created at all vertical depths within the semiconductor material. It is also obvious that optoelectronic devices manufactured from silicon crystal would be advantageous.

SUMMARY OF THE INVENTION

It is an aim of the present invention to provide a low-cost yet reliable method for fabricating multiple p-n junctions in semiconductor material, in that small dimensions of such junctions are maintained, and associated lattice dislocations of such junctions may be preferentially maintained, and unique electronic devices with such fabricated multiple p-n junctions. Typically, such semiconductor is a silicon wafer and the desired p-n junctions are vertical, continuous between both major surfaces of the wafer, presuming such wafer is oriented horizontally. The method can be described as patterned neutron transmutation doping using neutron optics. The invention is somewhat analogous to ultraviolet light projection microlithography, commonly used to form small patterns in photoresist in the manufacture of integrated circuits. This aim is achieved in the present invention by a method for obtaining patterned p-n junctions in semiconductor material, comprising:

a) a neutron moderator, to slow fast neutrons to thermal energies, b) a mask made from thermal neutron absorbing material, such as cadmium, placed in close proximity to such neutron moderator, c) thermal neutron focusing optics, such as compound refractive lenses, used to collect and focus thermal neutrons emitted from the mask such that the pattern or portion of the pattern is transferred by neutron-optical projection to the silicon body, d) and, controlled exposure of neutrons transmitted from the window areas in the mask and through the neutron optic so as to form the donor dopant concentration for the n-type regions by transmutation of silicon atoms into phosphorus.

Neutron Optics are well known (see: *Neutron and X-ray Optics*, J. T. Cremer, sec. 1.2) Generally, the refractive neutron lens is produced as a series of holes, double-parabolic in profile, with individual lens elements being formed by the material between the holes. As the index of refraction for most materials is less than 1 for these wavelengths, the bi-concave shape results in a positive lens. The refractive properties are very slight for a single lens element and many lens elements are used in series for a reasonable focal length.

A closely spaced series of N independent bi-concave lenses, each of focal length f1, results in a focal length f of:

$$f = \frac{f_1}{N} = \frac{R}{2N\delta}$$

The unit lens focal length f1 is given by:

$$f_1 = \frac{R}{2\delta},$$

where the complex refractive index of the lens material is expressed by: $n = 1 - \delta - i\beta$ and R is the radius of curvature of the lens. For parabolic unit lenses, $R = R_p$, the radius of curvature at the vertex of the paraboloid.

In a preferred embodiment of the present invention, a manufacturing apparatus for generating fine pattern(s) of thermal neutron exposure, includes an exit surface of a neutron moderating material as a source of thermal neutrons, a periodic one-dimensional (1-D) absorption mask for spatially modulating transmitted neutron intensity, and in the same orientation as the mask/grid, an array of focusing optics, such as an array of compound refractive neutron lenses, that capture and focus such transmitted neutrons such that a striped pattern is projected to semiconductor material, with such pattern possibly being de-magnified in relation to the size of the absorption mask. Stepping the position of the semiconductor material would allow for a complete exposure. Re-orientation of the semiconductor material would allow for complex patterns.

Alternatively, the mask and lens array can be 2-D for generating complex fine patterns of thermal neutron exposure.

Semiconductor devices are known comprising a p-n junction semiconductor material that provides a space-charge zone when depleted from a blocking junction. A p-type silicon material having an acceptor doping concentration (Na) for the p-type regions of the material is subjected to irradiation with focused beams of thermal neutrons, such that limited transmutation of silicon atoms into phosphorus at defined regions subjected to such irradiation form the n-type silicon donor (Nd) material. Crystal lattice dislocations accompany the neutron transmutation doping (NTD) process. These lattice defects of the crystal body can be reduced satisfactorily by a subsequent annealing treatment without the occurrence of significant dopant diffusion between the regions. Moreover, a strain field can be preferably engineered by intrinsic extended lattice defects such as an array of dislocation loops formed from patterned NTD and annealing. A radiation-emissive optoelectronic device comprising a junction formed, at least in part, from a region of p-type indirect bandgap semiconductor material and/or a region of n-type indirect bandgap semiconductor material, wherein said junction incorporates means effective, in operation of the device, to confine spatially, and thereby promote, radiative recombination of charge carriers.

According to a particular aspect of the present invention there is provided a radiation-emissive optoelectronic device comprising a junction formed, at least in part, from a region of p-type indirect bandgap semiconductor material and/or a region of n-type indirect bandgap semiconductor material, wherein said junction incorporates means effective, in operation of the device, to confine spatially, and thereby promote, radiative recombination of charge carriers. Said charge carrier confinement means is preferably a strain field.

In a preferred implementation of the invention, said strain field is preferably created by intrinsic extended lattice defects such as an array of dislocation loops.

According to another particular aspect the present invention, there is provided a method of fabricating a semiconductor wafer of a depletable multiple-region semiconductor material comprising alternating p-type and n-type regions which together provide a voltage-sustaining space-charge zone when depleted, including the steps of providing a p-type silicon body having an acceptor doping concentration corresponding to that required for the p-type regions of the material across the thickness of the body, and subjecting the silicon body to irradiation with collimated beams of thermal neutrons at window areas in a mask so as to form the n-type regions by transmutation of silicon atoms into phosphorus, whereby the phosporus dopant concentration of the resulting n-type regions extends across the thickness of the body between the opposite major surfaces of the body so that the p-n junctions formed between the alternating p-type and n-type regions terminate at the opposite major surfaces of the body.

Very good control is possible over the composition of the original p-type silicon body, whose resistivity can be precisely measured to determine its correct (low) dopant concentration level before the local neutron transmutation doping (NTD) stage. The precise neutron dose for the desired NTD concentration of phosphorus can also be accurately calibrated. By using NTD in this manner to provide a starting wafer for device manufacture, problems arising from NTD of highly doped device regions/substrates do not arise. In the subsequent device manufacture, a highly doped region/substrate may be provided at a major surface of the wafer by dopant implantation and/or diffusion or by bonding a highly doped wafer to that major surface.

The body may be of a suitable thickness to form the desired wafer for device manufacture. However, thermal neutrons have a large penetration depth in silicon. Thus, a thicker body can readily be used for the NTD. Then, after the NTD, the method may include a further step of slicing the silicon body transverse to the p-n junctions between the p-type and n-type regions so as to form the desired device wafer as a thinner body. Similarly, multiples of the desired thinner body device wafer can be stacked prior to the NTD, with the method including a further step of separating the stack.

A wafer fabricated in accordance with the invention can be advantageously used for the manufacture of a high voltage MOSFET device having a low on-resistance. Thus, source and drain regions my be provided adjacent to respective first and second opposite major faces of the wafer, the source region being separated from the multiple p-n junctions of the space-charge zone by a channel-accommodating body region of opposite conductivity type to the drain region. A wafer of a first conductivity type may be bonded to the second major surface of the wafer of the depletable multiple-region semiconductor material, so as to provide the drain region at said second major surface.

Phosphorus is imparted into silicon via neutron transmutation both as a dopant to form a p-n junction, as well as a means of introducing dislocation loops. The dislocation loops introduce a local strain field, which modifies the band structure and provides spatial confinement of the charge carriers. It is this spatial confinement which allows room-temperature electroluminescence at the band-edge.

By introducing a strain field created by local distortions on an atomic scale in the structure of a semiconducting or insulating crystal, it is possible locally to modify the properties of the associated bandgap. One consequence of this is that it has proved feasible to fabricate radiation-emitting devices from materials such as silicon.

A preferred mechanism for the creation of a strain field is the formation of an array of dislocation loops.

According to the present invention there is provided an electronic or optoelectronic device fabricated from a crystalline material in which a parameter of a band structure characteristic of said crystalline material has been modified locally by introducing distortions on an atomic scale in the lattice structure of said crystalline material and wherein a desired electronic or optoelectronic parameter of said device is obtained as a result of said the modification of the band structure.

According to this invention, a photovoltaic cell can be made having a body portion of a depletable multiple-region (multiple p-n junctions) semiconductor material that comprises alternating p-type and n-type doped regions extend through the full body. The regions together provide a voltage-sustaining space-charge zone when depleted in a blocking state of the semiconductor. Typically, the p-type silicon body is exposed to neutron irradiation in accordance with this invention such that certain regions, have many silicon atoms transmuted to phosphorus atoms thereby, become n-typed doped regions. At each junction, a depletion zone is formed. Photons arriving at various depths in these depletion zones are highly likely to be converted to electron-hole pairs. Function is improved by including an insulating/reflective coating and an anti-reflection coating. Backside interlaced metal traces provide a means of moving charge.

According to this invention, a thermoelectric device can be made having a body portion of a multiple p-type, n-type, and i-type regions. The regions are connected by metal traces in typical thermoelectric cooler/heater fashion. Typically, the p-type doped silicon body is then half-exposed to rectilinear neutron irradiation in accordance with this invention, thereby transmuting some silicon atoms to phosphorus atoms. A second step would rotate the silicon body around the axis of illumination by 90-degrees. Further rectilinear neutron irradiation, thereby transmuting portions to full n-type doping with additional transmutation to phosphorus. Regions between the unexposed regions of original p-type doped silicon and the fully exposed regions are half-exposed i-type (insulated) silicon.

BRIEF DESCRIPTION OF THE DRAWINGS

These and other advantageous technical features in accordance with the present invention are set out in the appended claims. They are illustrated in embodiments now described, by way of example, with reference to the accompanying diagrammatic drawings, in which:

Figure 1:
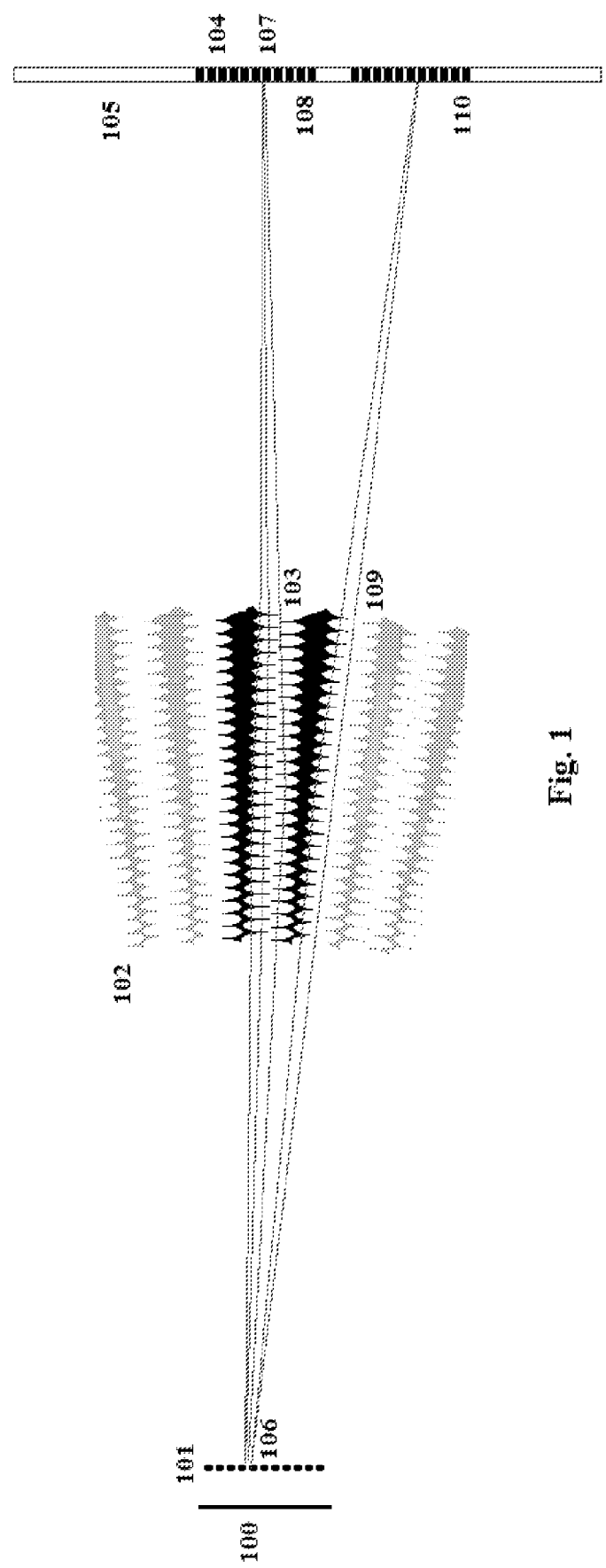
FIG. 1 is a schematic diagram of a manufacturing apparatus according to one embodiment of the disclosed invention, for generating fine pattern(s) of thermal neutron exposure which may have demagnification.

It should be noted that the Figures are diagrammatic, relative dimensions and proportions of parts of the drawings having been shown exaggerated or reduced in size, and expanded for the sake of clarity and convenience in the drawings. Thus, for example, the thickness is typically at least an order of magnitude larger than the widths. The same reference signs are generally used to refer to corresponding or similar features in modified and different embodiments.

DESCRIPTION OF THE PREFERRED EMBODIMENTS

General Aspects

FIG. 1, is a schematic diagram of a manufacturing apparatus according to one embodiment of the disclosed invention, shown in the "side view," having an exit surface of a neutron moderating material 100 as a source of thermal neutrons, a primary periodic one-dimensional (1-D) absorption mask 101 for spatially modulating transmitted intensity, and in the same orientation as the mask/grid, an array of focusing optics 102, such as an array of compound refractive neutron lenses. Portions of the primary mask-modulated field of thermal neutron-radiation are captured and focused by an individual optic 103 in the array 102 such that a striped pattern 104 is formed at the semiconductor material 105. As shown, the lens array consists of extruded ribbons of low-Z material with each major surface of each ribbon sculpted as to form a half-lens. Again as shown, the diameter of individual lens elements increases in size from one edge of the ribbon to the other. When assembled precisely, an array of a-diametric cylindrical lenses is completed. Thermal neutrons emitted from a single window/slit 106 that fall incident on the entrance aperture of a single compound refractive lens 103 will be captured and focused to a single line of thermal neutron exposure 107. The effect is that the full grid 101 is imaged as a striped pattern 108, albeit upside down. Thermal neutron-radiation emitted through the mask 101 that falls incident on a different lens 109 will form a separate pattern 110. Stepping allows for a complete exposure of the material. Re-orientation of the semiconductor material 105 allows for complex patterns of neutron-transmuted material. The modulating mask (grid) and lens array can be 2-D (not shown).

Figure 2:
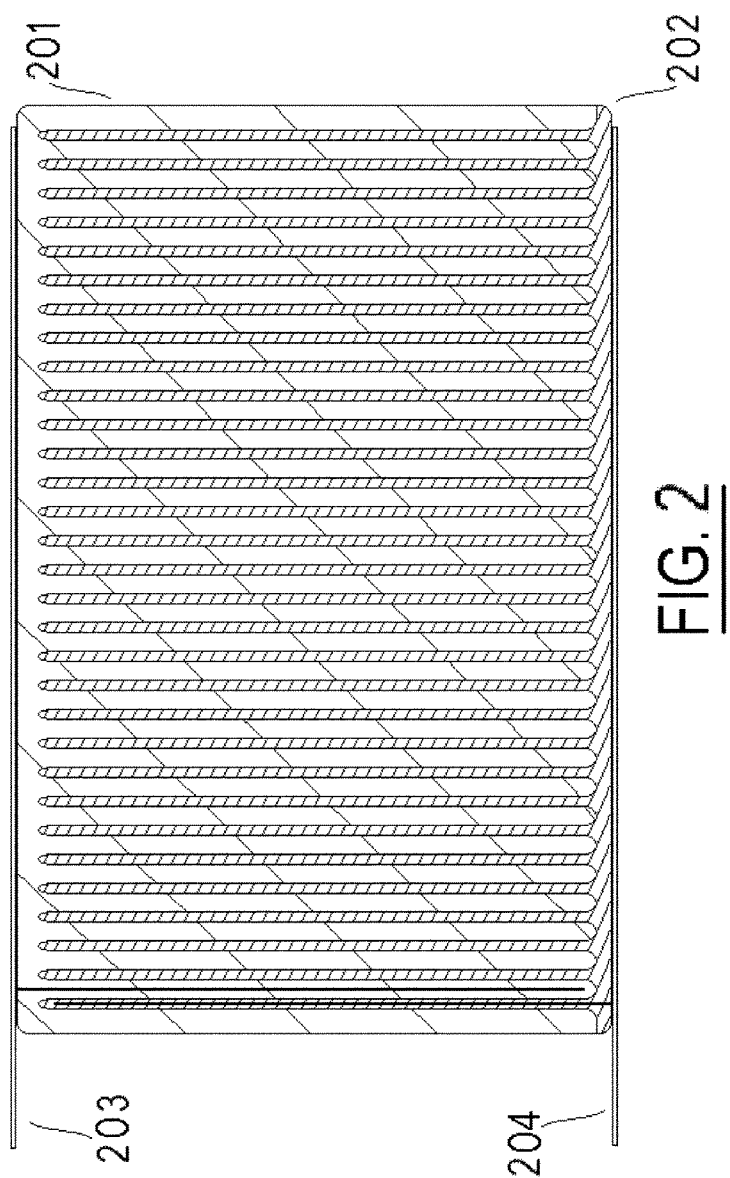
FIG. 2 is a schematic diagram view of a major surface (top view) of a silicon photovoltaic cell manufactured in accordance with the invention.

FIG. 2 is a schematic diagram of a unique device, a photovoltaic cell, according to this invention. It includes a monocrystalline or polycrystalline silicon material having a body portion of a depletable multiple-region (multiple p-n junctions) semiconductor material that comprises alternating p-type and n-type regions 201 and 202 respectively. The regions 201 and 202 together provide a voltage-sustaining space-charge zone when depleted in a blocking state of the semiconductor. Typically, the silicon body 201 is p-type doped and then exposed to neutron irradiation in accordance with this invention such that certain regions 202, have many silicon atoms transmuted to phosphorus atoms thereby. Backside metal traces 203 & 204 (for clarity, only two shown) provide a means of moving charge.

It is obvious from FIG. 2 that other electronic devices, including RESURF and MOSFET devices could be built from the patterned neutron transmutation doped silicon material.

Figure 3:
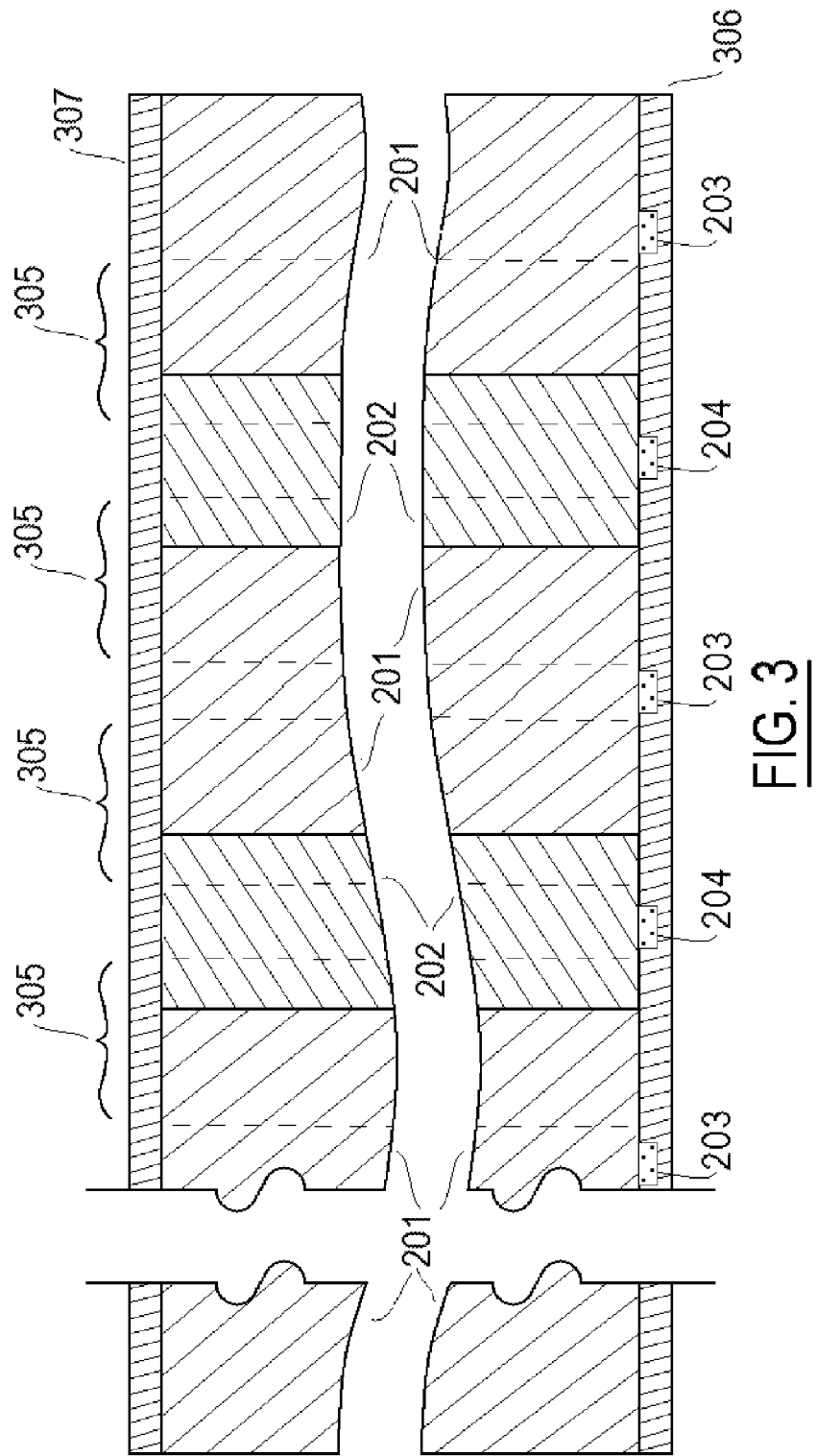
FIG. 3 is a schematic diagram cross-sectional view (expanded side view) of the silicon photovoltaic cell of FIG. 1.

FIG. 3 is a schematic diagram cross-sectional view (expanded side view) of the silicon photovoltaic cell of FIG. 2, in which the backside metal traces 203 and 204 are shown below the silicon body. Alternating p-type 201 and n-type 202 doped silicon extend through the full body. At each junction, a depletion zone 305 is formed. Photons arriving at various depths in these depletion zones 305 are highly likely to be converted to electron-hole pairs. Function is improved by including a insulating/reflective coating 306 and an anti-reflection coating 307.

Figure 4:
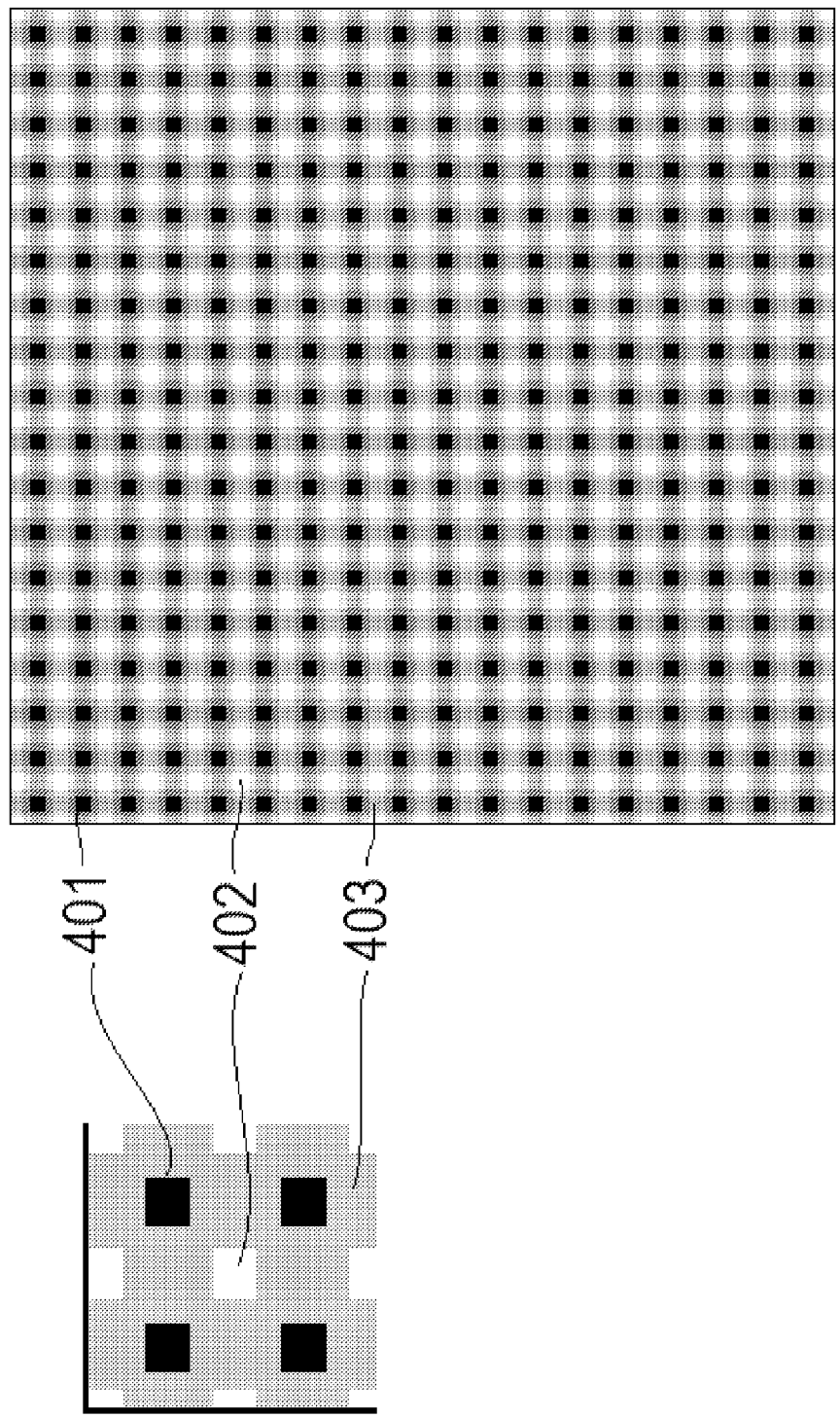
FIG. 4 is a schematic diagram view of a major surface (top view) of a silicon thermoelectric device manufactured in accordance with the invention.

The thermoelectric device of FIG. 4, shown with inset, includes a monocrystalline or polycrystalline silicon body having a body portion of a multiple p-type 401, n-type 402, and i-type 403 regions. The regions 401 and 402 are connected by metal traces (not shown) in typical thermoelectric cooler/heater fashion. Typically, the silicon body 401 is p-type doped and then half-exposed to rectilinear neutron irradiation in accordance with this invention, thereby transmuting some silicon atoms to phosphorus atoms. A second step would rotate the silicon body around the axis of illumination by 90-degrees, with further rectilinear neutron irradiation, thereby transmuting portions 402 to full n-type doping with phosphorus. Regions between the unexposed regions of original p-type doped silicon 401 and the fully exposed regions 402 are half-exposed i-type (insulated) silicon.

Figure 5:
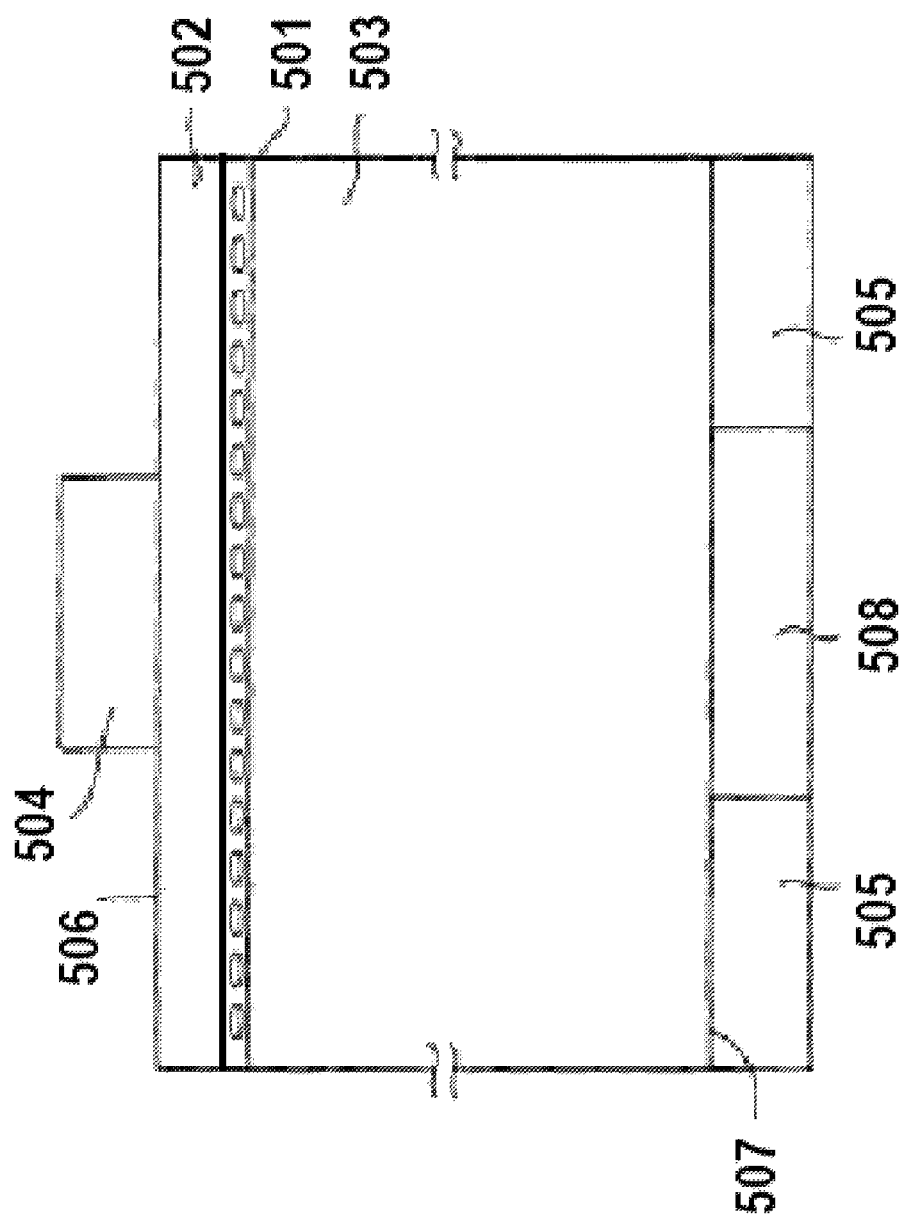
FIG. 5 is a schematic diagram view of materials (side view) of a silicon light emitting diode manufactured in accordance with the invention.

Referring now to FIG. 5, the radiation-emissive optoelectronic device has the form of a diode comprising a p-n junction array section 501 between a region 502 of p-type silicon and a region 503 of n-type silicon.

Contacts 504, 505 are provided on the front and back surfaces 506, 507 of the device enabling a bias voltage to the applied across the junction 501. Contact 505 has a central window 508 through which electroluminescence produced by the device can pass.

The junction region 501 incorporates a strain field. In this embodiment, the strain field is created by extended intrinsic lattice defects such as an array of dislocation loops situated in the p-type silicon.

The effect of the strain field is locally to modify the structure of the silicon bandgap. More specifically, the strain field around each extended lattice defect gives rise to a three-dimensional potential well which varies inversely as a function of distance from the core of the dislocation loop. It is believed that the combined effect of the potential wells is to cause spatial confinement of mobile charge carriers thereby significantly reducing their diffusion to point defects in the silicon where fast, non-radiative recombination processes would otherwise take place. It has been found that the effect of a strain field of the kind described is to suppress non-radiative recombination of charge carriers, which is usually the dominant process, and to promote radiative recombination of charge carriers which, hitherto, has been almost entirely absent in devices made from indirect bandgap materials such as silicon. As will be described in greater detail hereinafter, when a forward bias voltage is applied across junction 501 significant amounts of electroluminescence are generated by the device.

In this implementation, the transmuted phosphorus atoms serve dual functions so to be used as dopant atoms defining the p-type region 502 of the junction and they are also used to create lattice dislocations in that region. The subsequent annealing step activates the transmuted dopant atoms and also leads to aggregation of the dislocations which causes the required dislocation loop array to form.

From reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein. Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention. The Applicants hereby give notice that new claims may be formulated to any such features and/or combinations of such features during the prosecution of the present Application or of any further Application derived therefrom.

What is claimed is:

1. A method of modifying the elemental composition of a material by means of neutron transmutation, wherein neutron exposure is controlled by means of neutron focusing optics, including the steps of: (a) providing a material body, (b) providing a neutron source with a patterned mask absorbing certain regions and transmitting desired features, (c) providing a neutron focusing optic to capture and transmit neutrons from said mask onto one of the major surfaces of the material body, and (d) subjecting the material body to irradiation with neutrons transmitted from the window areas in the mask and through the neutron optic so as to form the transmuted elements.

2. A method of claim 1 for fabricating a semiconductor wafer of a depletable multiple-region semiconductor material in the form of alternating p-type and n-type regions which together provide a voltage-sustaining space-charge zone when depleted, the method including the steps of: (a) providing a p-type semiconductor body having an acceptor doping concentration extending through the thickness of the body between opposite major surfaces of the body, which acceptor doping concentration corresponds to that required for the p-type regions of the material, (b) providing a neutron source with a patterned mask absorbing certain regions and transmitting desired features, (c) providing a neutron focusing optic to capture and transmit neutrons from said mask onto one of the major surfaces of the semiconductor body, wherein the mask's window area features are imaged to locations in the semiconductor body where the n-type regions are desired; (d) subjecting the semiconductor body to irradiation with neutrons transmitted from the window areas in the mask and through the neutron optic so as to form the donor dopant concentration for the n-type regions by transmutation of semiconductor atoms, which donor dopant concentration extends across the thickness of the body between the opposite major surfaces of the body so that p-n junctions formed between the alternating p-type and n-type regions terminate at the opposite major surfaces of the body; and (e) wherein the neutron irradiation is continued until the resulting n-type regions have a donor dopant concentration p type.

3. A method of claim 1 for fabricating a radiation-emissive optoelectronic device of a depletable multiple-region semiconductor material in the form of alternating p-type and n-type regions which together provide a strain field by intrinsic extended lattice defects, such as an array of dislocation loops, comprised of junctions formed, at least in part, from regions of p-type indirect bandgap semiconductor material and/or a region of n-type indirect bandgap semiconductor material, wherein said junctions confine charge spatially, and thereby promote, radiative recombination of charge carriers.

4. A method of claim 1, further comprising a step of slicing the semiconductor body.

5. A method as described in claim 1, wherein, before the neutron transmutation doping step, the method includes a prior step of stacking thin bodied semiconductor wafers for simultaneous transmutation.

6. A method as described in claim 3, wherein the focused beams are well-defined narrow circular beams.

7. A method of manufacturing a photovoltaic cell device with a wafer fabricated by a method as described in claim 2, the method including the further step of metallization, wherein source and drain metallization are provided adjacent second major surface of the wafer, the source metallization being separated from the drain metallization.

8. A method of manufacturing a thermoelectric device with a wafer fabricated by a method as described in claim 1, the method including the further step of metallization, wherein source and drain metallization are provided adjacent respective first and second opposite major surface of the wafer.

9. A method of manufacturing a high voltage MOSFET device with a wafer fabricated by a method as described in claim 2 wherein source and drain regions are provided adjacent respective first and second opposite major surfaces of the wafer.

10. A photovoltaic device with multiple p-n junctions aligned perpendicular to the major surfaces of the semiconductor wafer, manufactured according to claim 7 with source and drain metallization provided adjacent second major surface of the wafer, the source metallization being separated from the drain metallization.

11. A thermoelectric device with multiple transmuted elements, and with source and drain metallization provided adjacent respective first and second opposite major faces, manufactured according to claim 8.

12. An optoelectronic device with a strain field induced by intrinsic extended lattice defects such as an array of dislocation loops manufactured according to claim 3.

* * * * *

UNITED STATES PATENT AND TRADEMARK OFFICE
CERTIFICATE OF CORRECTION

PATENT NO. : 9,887,087 B1
APPLICATION NO. : 14/325647
DATED : February 6, 2018
INVENTOR(S) : Michael Keith Fuller It is certified that error appears in the above-identified patent and that said Letters Patent is hereby corrected as shown below:

In the Claims

Column 10, Line 10, Claim 2, cancel the text at the end of the sentence "p type," as the sentence should end with the word "concentration."

Signed and Sealed this
First Day of May, 2018

Andrei Iancu
*Director of the United States Patent and Trademark Office*